United States Patent
Douglas

(10) Patent No.: US 7,154,329 B2
(45) Date of Patent: Dec. 26, 2006

(54) METHOD AND APPARATUS FOR COMPENSATING AMPLIFIER OUTPUT FOR TEMPERATURE AND PROCESS VARIATIONS

(75) Inventor: Dale Scott Douglas, Jersey City, NJ (US)

(73) Assignee: M/A-COM, Inc., Lowell, MA (US)

( * ) Notice: Subject to any disclaimer, the term of this patent is extended or adjusted under 35 U.S.C. 154(b) by 0 days.

(21) Appl. No.: 11/013,841

(22) Filed: Dec. 16, 2004

(65) Prior Publication Data

US 2006/0132230 A1    Jun. 22, 2006

(51) Int. Cl.
*G01R 19/00* (2006.01)
(52) U.S. Cl. .............................. 330/2; 330/277; 330/51
(58) Field of Classification Search .................... 330/2, 330/277, 51
See application file for complete search history.

(56) References Cited

U.S. PATENT DOCUMENTS

| | | | |
|---|---|---|---|
| 4,534,040 A | 8/1985 | Thapar | 375/39 |
| 4,580,111 A | 4/1986 | Swanson | 332/41 |
| 4,638,190 A | 1/1987 | Hwang et al. | 307/512 |
| 4,734,751 A | 3/1988 | Hwang et al. | 357/22 |
| 4,804,931 A | 2/1989 | Hulick | 332/31 R |
| 4,864,162 A * | 9/1989 | Maoz | 327/581 |
| 4,901,032 A | 2/1990 | Komiak | 330/277 |
| 4,947,136 A | 8/1990 | Helms | 330/54 |
| 4,947,455 A | 8/1990 | Swanson | 455/115 |
| 4,952,890 A | 8/1990 | Swanson | 332/152 |
| 5,049,841 A | 9/1991 | Cooper et al. | 333/81 R |
| 5,268,658 A | 12/1993 | Edwards | 332/151 |
| 5,367,272 A | 11/1994 | Hulick | 332/149 |
| 5,392,007 A | 2/1995 | Cripe | 332/149 |
| 5,450,044 A | 9/1995 | Hulick | 332/103 |
| 5,469,127 A | 11/1995 | Hulick et al. | 332/149 |
| 5,621,351 A | 4/1997 | Puri et al. | 330/10 |
| 5,867,071 A | 2/1999 | Chethik | 332/103 |
| 5,886,573 A | 3/1999 | Kolanek | 350/10 |
| 6,041,082 A | 3/2000 | Takeda et al. | 375/300 |
| 6,130,910 A | 10/2000 | Anderson et al. | 375/238 |
| 6,147,553 A | 11/2000 | Kolanek | 330/10 |
| 6,255,906 B1 | 7/2001 | Eidson et al. | 330/124 R |
| 6,377,784 B1 | 4/2002 | McCune | 455/108 |
| 6,411,655 B1 | 6/2002 | Holden et al. | 375/269 |
| 6,586,989 B1 * | 7/2003 | Perner et al. | 330/9 |
| 6,590,413 B1 * | 7/2003 | Yang | 326/30 |
| 6,636,112 B1 | 10/2003 | McCune | 330/10 |
| 6,658,238 B1 | 12/2003 | Ursenbach et al. | 455/102 |
| 6,738,432 B1 | 5/2004 | Pehlke et al. | 375/300 |

(Continued)

OTHER PUBLICATIONS

King-Chun Tsai and Paul R. Gray, "*A 1.9-GHz, 1-W CMOS Class-E Power Amplifier for Wireless Communications*"; IEEE Journal of Solid-State Circuits, vol. 34, No. 7, Jul. 1999, pp. 962-970.

(Continued)

*Primary Examiner*—Patricia Nguyen

(57) ABSTRACT

An amplifier circuit includes a calibration circuit with a controllable circuit element such as a digital resistor. One or more properties of the controllable circuit element (e.g., the resistance in a digital resistor) is varied by a digital calibration word such that the voltage drop across the resistor matches a reference voltage. The calibration word is also used to control the resistance of a transistor that forms a part of a power amplifier to compensate for temperature and process variations. The amplifier may be a switching power amplifier, and the transistor may be a segmented transistor with the width (and hence the channel resistance) controlled by the digital calibration word.

20 Claims, 4 Drawing Sheets

U.S. PATENT DOCUMENTS

| | | | |
|---|---|---|---|
| 6,791,417 B1 | 9/2004 | Pengelly et al. | 330/295 |
| 6,799,020 B1 | 9/2004 | Heidmann et al. | 455/103 |
| 6,816,008 B1 | 11/2004 | Kontson | 330/51 |
| 6,930,552 B1* | 8/2005 | Miyagi | 330/277 |
| 2005/0030104 A1 | 2/2005 | Chen et al. | 330/295 |
| 2005/0114111 A1* | 5/2005 | Zhang et al. | 703/14 |

OTHER PUBLICATIONS

Nathan O. Sokal, WA1HQC of Design Automation, Inc., ARRL Technical Advisor. "*Class-E RF Power Amplifiers*"; QEX Jan./Feb. 2001, pp. 9-20.

Richard C. Jaeger, Auburn University, "*Tutorial: Analog Data Aquisition Technology, Part-II-Analog-to-Digital Conversion*"; IEEE Micro, Aug. 1982, pp. 46-56.

C. K. T. Chan and C. Toumazou, "*Linear Class E Power Amplifier for mobile communications*"; http://infoeng.ee.ic.ac.uk/www_section/students/thomaschan/ClassEPA.html, Mar. 22, 2004.

George J. Krausse, Directed Energy, Inc., "*1KW Class-E 13.56MHz Single Device RF Generator for Industrial Applications*"; 2000 Directed Energy, Inc., Doc. #9300-0001 Rev 1, pp. 1-16.

The Official Class E Transmitter Web Site by WA1QIX, "*Class E AM Transmitter Descriptions, Circuits, Etc.* [Updated Jan. 29, 2004]"; http://www.classradio.com/, Apr. 26, 2004 (25 pages).

Jingshi Yao, Tony Long and Stephen I. Long, "*High Efficiency Switch Mode Amplifiers for Mobile and Base Station Applications*"; Department of Electrical and Computer Engineering, University of California, Final Report 2000-2001 for MICRO Project 00-061 (4 pages).

Ahmadreza Rofougaran, Glenn Chang, Jacob J. Rael, James Y.-C. Chang, Maryam Rofougaran, Paul J. Chang, Masoud Djafari, M.-K. Ku, Edward W. Roth, Asad A. Abidi and Henry Samueli; "*A Single-Chip 900 MHz Spread-Sprectrum Wireless Transceiver in 1-βm CMOS—Part 1: Architecture and Transmitter Design*"; IEEE Journal of Solid-State Circuits, vol. 33, No. 4, Apr. 1998.

M. Rofougaran, A. Rofougaran, C. Olgaard, and A. A. Abidi; "*A 900 MHz CMOS RF Power Amplifier with Programmable Output*", 1994 Symposium on VLSI Circuits Digest of Technical Papers.

* cited by examiner

US 7,154,329 B2

METHOD AND APPARATUS FOR COMPENSATING AMPLIFIER OUTPUT FOR TEMPERATURE AND PROCESS VARIATIONS

FIELD OF THE INVENTION

The invention relates generally to electromagnetic processing, and more particularly to the amplification of electromagnetic waves.

BACKGROUND OF THE INVENTION

The controlled amplification of electromagnetic waves has many uses. For example, intelligence may be conveyed along a wave by amplifying electromagnetic wave characteristics so that the amplified wave can be perceived after transmission through a medium at a distance. Power amplifiers are commonly used in the communications field to increase the power of a modulated RF (radio frequency) signal which is then delivered to an antenna for transmission through the atmosphere. One widely used type of power amplifier is the switch-mode power amplifier, in which a transistor acts as a switch.

The output power of a switch-mode power amplifier is proportional to the resistance of the switch, however the switch may be implemented (for example, a MOS transistor acting in triode as a switched resistor). In many applications, especially cellular communications systems, it is important to control precisely the output power of the power amplifier. However, the resistance of the transistor, and thus the output power of the switch-mode power amplifier, varies depending upon the operating temperature of the device. Moreover, the output power of individual power amplifiers also varies from amplifier to amplifier as a result of process variations that occur during the fabrication of the devices. This is especially true when the power amplifier is fabricated as an integrated circuit using CMOS (complementary metallic oxide semiconductor) processes.

What is needed is a technique for compensating the output power of a power amplifier for temperature and process variations.

SUMMARY OF THE INVENTION

Embodiments of the present invention include apparatii, methods, and articles of manufacture for amplifying electromagnetic waves. Preferred embodiments employ a calibration circuit with a controllable circuit element such as a digital resistor. One or more characteristics of the controllable circuit element (e.g., a resistance in a digital resistor) is varied by a digital calibration word such that the voltage drop across the resistor matches a reference voltage. The calibration word is then used to control the channel resistance of a transistor that forms a part of a power amplifier to compensate for temperature and process variations. In preferred embodiments, the power amplifier is a switching power amplifier, and the transistor is a segmented transistor with a width (and hence a channel resistance) controlled by the digital calibration word.

BRIEF DESCRIPTION OF THE DRAWINGS

A more complete appreciation of the invention and many of the attendant features and advantages thereof will be readily obtained as the same become better understood by reference to the following detailed description when considered in connection with the accompanying drawings, wherein.

DETAILED DESCRIPTION

Figure 1:
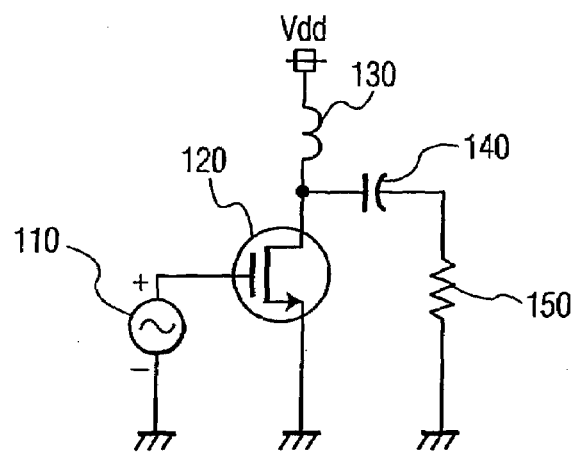
FIG. 1 is a circuit diagram of a conventional power amplifier.

The present invention will be discussed with reference to preferred embodiments of apparatus, methods, and articles of manufacture for amplifying electromagnetic waves. Specific details are set forth in order to provide a thorough understanding of the present invention. The preferred embodiments discussed herein should not be understood to limit the invention. Furthermore, for ease of understanding, certain method steps are delineated as separate steps; however, these steps should not be construed as necessarily distinct nor order dependent in their performance. Embodiments of the invention may be comprised of hardware or a combination of hardware and software. Accordingly, individual blocks and combinations of blocks in the drawings may be embodied in many different ways, as is well known to those of ordinary skill in the art.

It should be noted that the word "signal" is used herein to describe an electromagnetic wave that has been modulated in some fashion, usually by the impression of intelligence upon the wave, for example by imposing data upon a carrier wave. It should also be noted that the use of "signal" and "wave" in the singular includes the plural (or multiple signals and waves respectively) as often transmitters generate more than one signal and/or wave in the normal course of their operation. It should also be noted that embodiments of the present invention might be used to output waves as well as signals as is further described below.

FIG. 1 illustrates a conventional power amplifier 100. A signal from a signal source 110 is connected to a gate of an NFET 120. The drain of NFET 120 is connected to a voltage source $V_{dd}$ via RF choke inductor 130. A resistive load 150 is also connected to the drain of NFET 120 via a coupling/matching capacitor 140. The source of NFET 120 is connected to ground. When $V_{GS}$ is high, the NFET is in the "off" state. In the "off" state, no current flows from the drain to the source (the drain-source voltage $V_{DS}$ is therefore zero) and $V_{dd}$ drives the capacitive load 140. When $V_{GS}$ is low, the NFET is in the "on" state and current flows through the drain and source of NFET 120. Ideally, the drain-source resistance of NFET 120 would be zero so that there would be no power dissipated by the NFET 120. Of course, this is not possible in an actual device and the current flowing through the NFET 120 will give rise to a drain-source voltage $V_{DS}$ that is a product of this current multiplied by the drain-source resistance of NFET 120.

Figure 2:
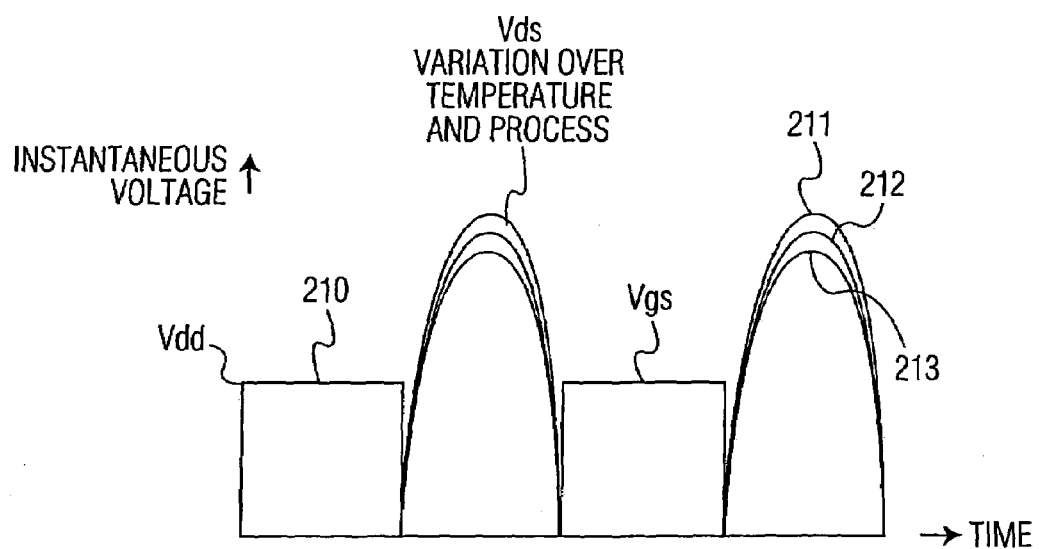
FIG. 2 is a plot of voltage as a function of time for the power amplifier of FIG. 1.

FIG. 2 is a plot 210 of the gate-source voltage $V_{GS}$ and three different plots 211, 212, 213 of drain-source voltages $V_{DS}$ as a function of time (it will be understood that FIG. 2 depicts plots for ideal transistors). The variation in the drain-source voltage $V_{DS}$ plots 211–213 may reflect differences in the drain-source resistance of a single NFET 120 caused by variations in operating temperature of the device, or may reflect differences in drain-source resistance resulting from process variations occurring between different NFETs 120. In either case, since the power available from a switch-mode power amplifier is proportional to the drain-source resistance of the NFET 120, these differences in drain-source resistance result in differences in output power.

The above-discussed differences in drain-source resistance may be compensated for by employing a FET with a drain-source channel resistance that can be controlled. In preferred embodiments, the FET is a segmented FET in which the channel width (and hence resistance) of the device is controlled by a digital calibration word.

Figure 3:
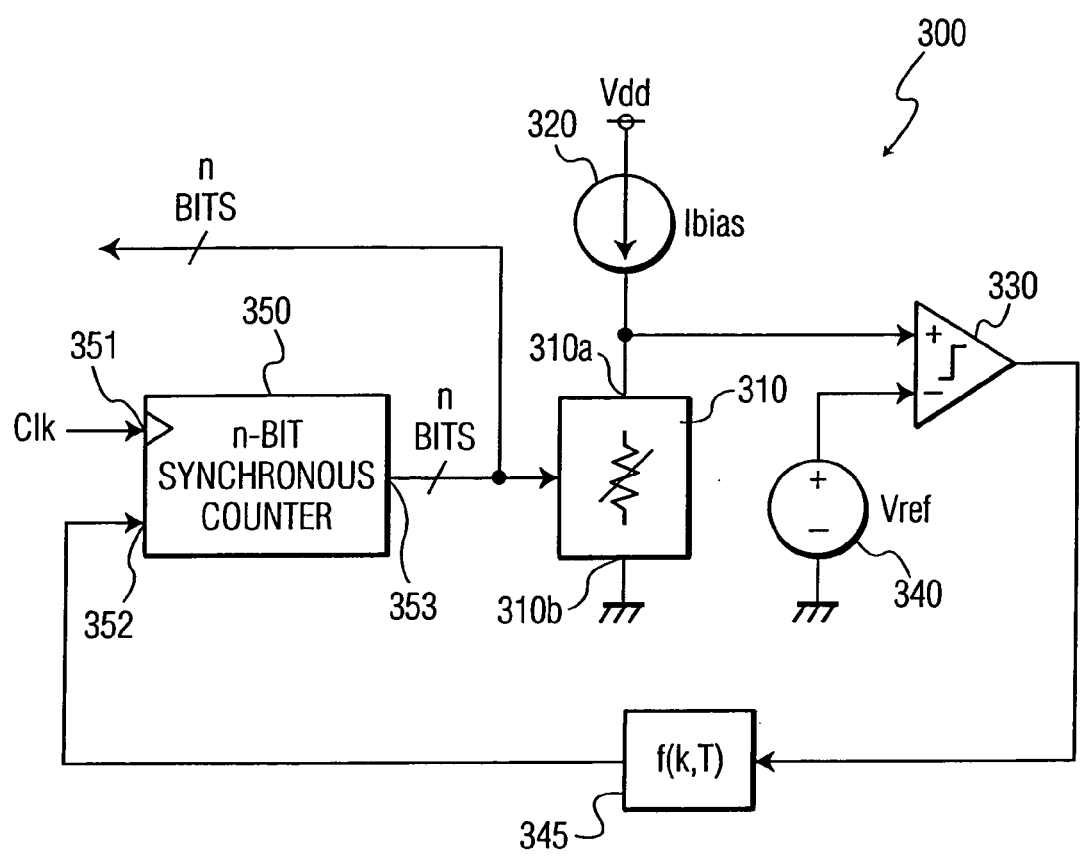
FIG. 3 is a circuit diagram of a calibration circuit according to a first embodiment of the invention.

A calibration circuit 300 for generating the digital calibration word is illustrated in FIG. 3. The circuit functions to control the resistance of a digital resistor 310 such that the product of a reference current and the resistance of the digital resistor 310 matches a reference voltage. The reference voltage and reference current will remain constant over temperature and process variations, but the resistance of the digital resistor 310 will vary for a given calibration word. In some ways, the calibration circuit 300 is similar to that used in tracking analog-digital converters as discussed in R. C. Jaeger, "Tutorial: Analog Data Acquisition Technology, Part II—Analog-to-Digital Conversion," IEEE MICRO, Vol. 2, No. 3, Aug. 1982, p. 50.

One terminal 310*a* of the digital resistor 310 is connected to a reference current source 320 and the other terminal 310*b* is connected to ground. As discussed above, the reference current source 320 is constructed such that it will provide a reference current that will remain constant over process and temperature variations. On the other hand, the digital resistor 310 is designed and manufactured such that its resistance matches (or varies in proportion to) that of a FET (not shown in FIG. 3) which is used in the power amplifier to be calibrated by the circuit 300. In other words, the digital resistor 310 is designed and manufactured such that its resistance for a given calibration word will vary over process and/or temperature in the same amount (or proportion) as that of the power amplifier FET.

The digital resistor terminal 310*a* is also connected to one of the input terminals of a comparator 330. The other input terminal of the comparator 330 is connected to a reference voltage source 340 that, like the reference current source 320, will remain constant over temperature and process variations. In some embodiments, the reference voltage is derived from a bandgap voltage reference. The output of the comparator 330 will be a "1" or a "0" depending on whether the voltage drop across the digital resistor 310 is more or less than the reference voltage from voltage source 340. The comparator output is connected to an up/down input 352 of an n-bit, synchronous up/down counter 350. In some embodiments, the comparator output is filtered by optional filter 345, which may be any of many suitable filters well known in the art, before input to the counter 350.

For each period of the clock signal input to the clock input 351 of the counter 350, the counter 350 will increment or decrement depending on whether the output of the comparator 330 is high or low, which in turn depends on whether the voltage drop across the digital resistor 310 is more or less than the reference voltage from voltage source 340. The n-bit count output 353 of the counter 350 forms the calibration word. The calibration word output by the counter 350 is connected to the control input of the digital resistor 310 to control its resistance such that the voltage drop across it matches the reference voltage from source 340.

Figure 4:
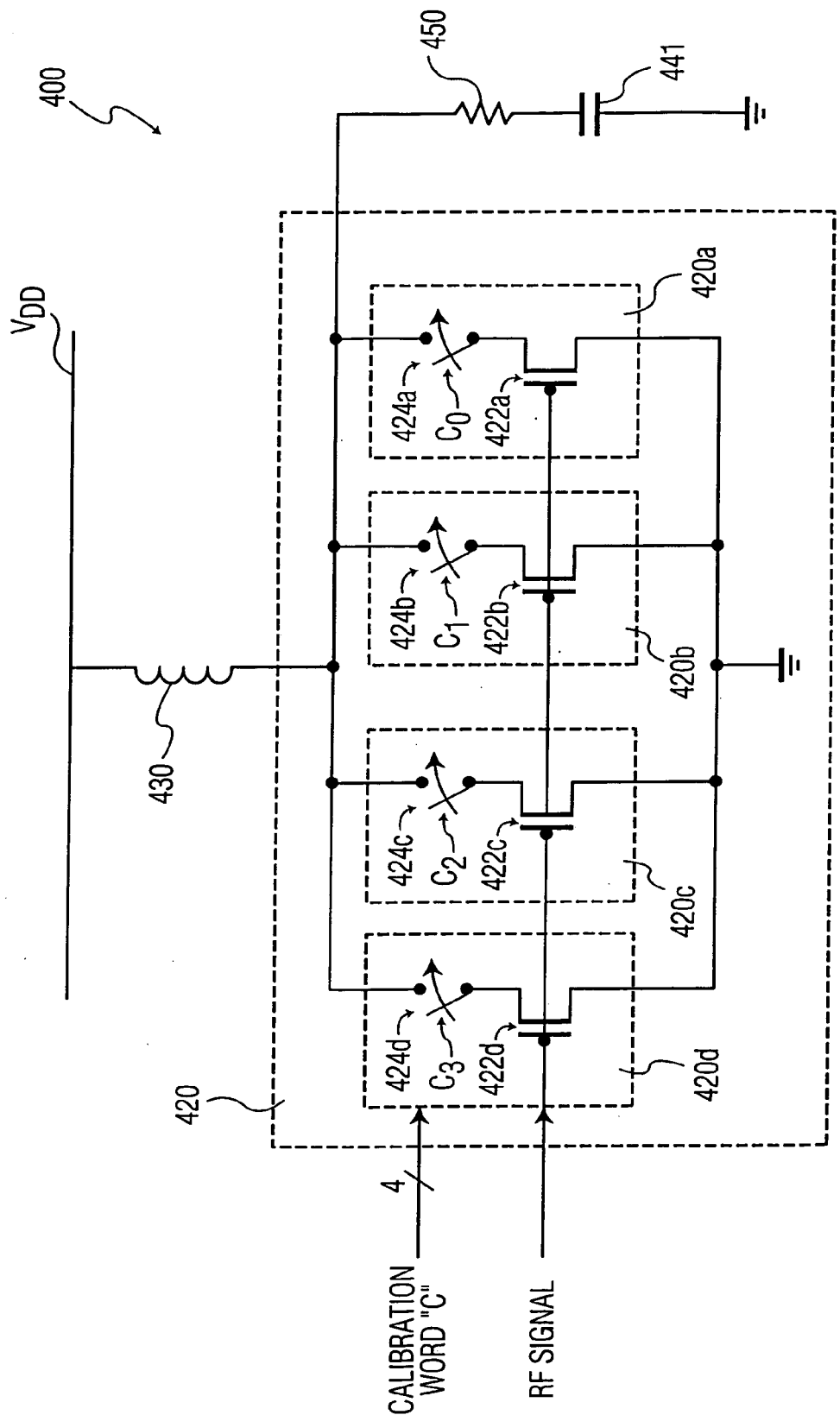
FIG. 4 is a circuit diagram of a power amplifier including a segmented field effect transistor that may be used with an output of the calibration circuit of FIG. 3 according to an embodiment of the invention.

The calibration word output by the counter 350 is also used to control the channel resistance of the FET 420 in the power amplifier 400 of FIG. 4. The FET 420 is segmented into a plurality of segment FETs 420*a*–*d* with channels having binary weighted widths. Segmented FETs are more fully described in, e.g., Rofougaran et al., "A Single-Chip 900 Mhz Spread Spectrum Wireless Transceiver in 1-:m CMOS—Part 1: Architecture and Transmitter Design,"IEEE Journal of Solid-State Circuits, Vol. 33, No. 4, Apr. 1998; and Rofougaran et al., "A 900 Mhz CMOS RF Power Amplifier with Programmable Output," 1994 Symposium on VLSI Circuits Digest of Technical Papers, pp. 134–135. The contents of both of these papers are hereby incorporated by reference herein.

The number of segment FETs into which the FET 420 is divided depends upon the precision with which it is desired to control the drain-source resistance. The number of bits in the calibration word from the counter 350 is chosen to match the number of segments into which the FET 420 is divided. In the embodiment of FIG. 4, the FET 420 is divided into four parallel segments 420*a*–*d*(of course, division into a larger or smaller number of segments is also possible). The first segment FET 422*a* has a width W, the second segment FET 422*b* has a width of W/2, the third segment FET 422*c* has a width of W/4 and the fourth segment FET 422*d* has a width of W/8.

The gate of each of the segment FETs 422*a*–*d* is connected to receive the signal to be amplified. The drains of each of the segment FETs 422*a*–*d* are selectively connectable to a voltage source $V_{DD}$ and an inductor 430 by digitally controlled switches 424*a*–*d*. The digitally controlled switches 424*a*–*d* (which may be implemented using an array of NFETs) are controlled by the calibration word (in this embodiment a 4-bit word, C3–C0) output from calibration circuit 300, with a 0 in the calibration word indicating that the switch is to be closed. The most significant bit of the calibration word 300 controls the segment FET 420*a* with the widest width. Thus, when the calibration word is 0000, all switches 424*a*–*d* are closed and the drains of all segment FETs 422*a*–*d* are connected to $V_{DD}$ such that the drain-source resistance of the FET 420 is at its lowest and the total channel width is at its widest.

Figure 5:
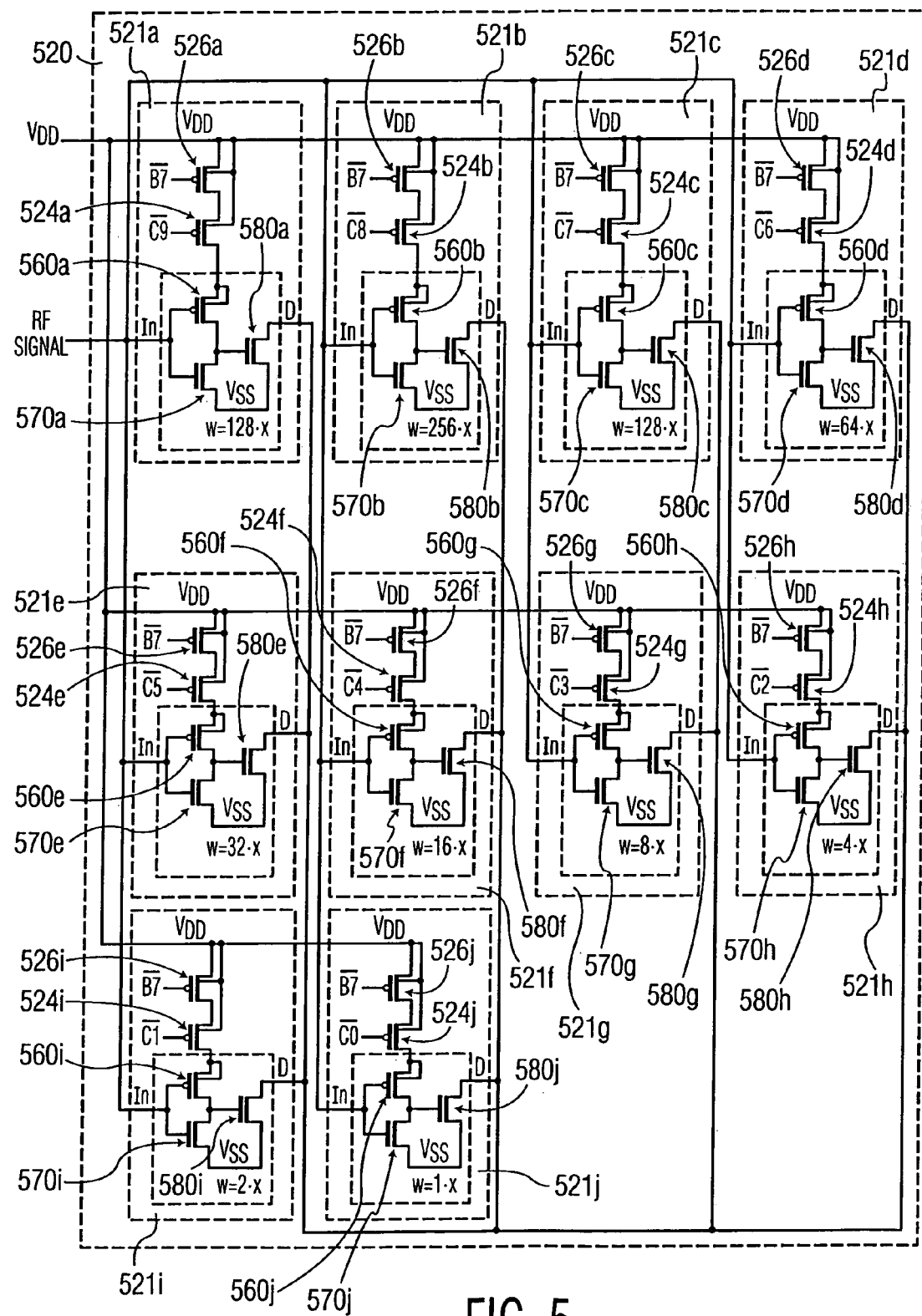
FIG. 5 is a circuit diagram of a segmented transistor that may be controlled with an output of the calibration circuit of FIG. 3 according to another embodiment of the invention.

FIG. 5 illustrates a segmented transistor 520 suitable for use in an RF power amplifier according to another embodiment of the invention. The segmented transistor 520 consists of ten segments 521*a*–*j*. The segments have varying widths, with the narrowest segment 521*j* having a width w =x and the widest segment 521*b* having a width w=256*x, where x represents $\frac{1}{640}^{th}$ of the total channel width. As will be discussed further below, the first segment 521*a* is configured such that it will always be active regardless of the value of the calibration word so that the width of the transistor 520 will never be less than a minimum width 128*x, or $\frac{128}{640}$=0.2W (where W is the entire channel width). This reduces the dynamic range of the segmented transistor 520, but increases the precision with which the channel width can be adjusted. Of course, it is also possible to practice the invention without such a "minimum width" transistor such that the width of the segmented transistor is completely controlled by the calibration word.

Each segment of the transistor 520 includes the same basic structure. A first stage PFET 526*a*–*j* has a drain connected to a voltage source $V_{DD}$ and a gate connected to a digital input $\overline{B7}$ which represents a digital signal to be amplified and modulated by the power amplifier 520. The source of the first stage PFET 526*a–j* is connected to the drain of a second stage PFET 524*a–j*. The gate of the first second stage PFET 524*a* is connected to a constant voltage source $V_{SS}$. This ensures that the segmented transistor 520 will always have a minimum width as discussed above. The gates of the remaining second stage PFETs 524*b–j* are connected to a corresponding bit of a nine bit calibration word $\overline{C8}$–$\overline{C0}$, with the least significant bit $\overline{C0}$ being connected to the second stage transistor 524*j* of the narrowest transistor segment 521*j* and the most significant bit $\overline{C8}$ being connected to the second stage transistor 524*b* of the widest transistor segment 521*b*. The source of each of the second stage transistors 524*a–j* is connected to a three transistor modulator/output stage comprising a PFET 560*a–j* with a drain connected to the source of an NFET 570*a–j* whose drain is connected to an NFET 580*a–j*. The gates of the NFET 560*a–j* and the PFET 570*a–j* are both connected to a CMOS level RF carrier In, and the gate of the NFET 580*a–j* is connected to the PFET 560*a–j* source/NFET 570*a–j* drain.

In the embodiments discussed above, the calibration word is used to calibrate the output of the power amplifier for process and temperature variations. Those of skill in the art will recognize that multiple digital "control" words could be generated—a first calibration word to calibrate the power output for process and temperature variations, and a second "power" word to provide a varying output power that was held constant over temperature and process variations by the first word. In such a system, the second "power" word could be mathematically combined (e.g., by subtraction) with the first "calibration" word to form a third word that would control the width of the segmented transistor (e.g., by controlling the "switches" 415 of FIG. 4 or the PFETs 515 of FIG. 5).

In preferred embodiments of the invention, the segmented FET is implemented in an integrated circuit using a CMOS process with either a distributed (transmission line) or a lumped configuration. However, those of skill in the art will recognize that various implementations of the segmented FET are possible. Moreover, it is also possible to realize the calibration circuit in different forms.

The invention has been discussed above primarily in the context of a switch-mode power amplifier. However, it should be understood that the invention is not so limited. For example, the invention may also be used with other types of amplifiers including variable gain amplifiers, digital gain amplifiers, and digitally controlled amplifiers.

While the invention has been described by illustrative embodiments, additional advantages and modifications will occur to those skilled in the art. Therefore, the invention in its broader aspects is not limited to the specific details shown and described above. Modifications may be made without departing from the scope and spirit of the invention. Accordingly, it is intended that the invention not be limited to the specific illustrative embodiments, but be interpreted within the full spirit and scope of the appended claims and their equivalents.

What is claimed is:

1. A method for calibrating an output of an amplifier comprising the steps of:
   providing an amplifier, the amplifier including a transistor, the transistor having a channel with a digitally controllable channel resistance, the channel resistance changing as a function of a calibration parameter;
   generating a calibration word to control a characteristic of a digitally controllable circuit element such that the characteristic remains at a desired level, the circuit element being configured such that the characteristic changes as a function of the calibration parameter in an amount proportional to an amount by which the resistance of the transistor changes as a function of the calibration parameter; and
   controlling the channel width of the transistor based on the calibration word such that the resistance of the transistor is calibrated for variations in the calibration parameter.

2. The method of claim 1, wherein the calibration parameter is selected from the group consisting of an operating temperature of the transistor and a fabrication process of the transistor.

3. The method of claim 1, wherein the circuit element is a digital resistor and the characteristic is resistance.

4. The method of claim 1, wherein the amplifier is a switching power amplifier and the transistor includes a segmented transistor.

5. The method of claim 4, wherein the segmented transistor comprises a plurality of FETs and the channel resistance is controlled by controlling a width of the channel of each FET as a function of the calibration word.

6. The method of claim 5, wherein a portion of the width of the segmented transistor is controlled by the calibration word, the portion being less than the entire width of the segmented transistor.

7. The method of claim 6, wherein an entire width of the segmented transistor is controlled by the calibration word.

8. The method of claim 1, wherein the transistor is fabricated using a CMOS process.

9. The method of claim 1, wherein the generating step comprises the steps of:
   comparing a reference voltage to a voltage drop across the resistor to generate a comparison value; and
   inputting the comparison value to an up/down counter to generating a new count value, the new count value corresponding to the calibration word.

10. An amplifier comprising:
    a transistor, the transistor having a channel with a digitally controllable channel resistance, the channel resistance changing as a function of a calibration parameter; and
    a calibration circuit including a circuit element having a digitally controllable characteristic that changes as a function of the calibration parameter in an amount proportional to an amount by which the resistance of the transistor changes as a function of the calibration parameter, the calibration circuit being connected to the transistor;
    wherein the calibration circuit is configured to generate a calibration word that maintains the characteristic of the circuit element at a desired level over changes in the calibration parameter and to output the calibration word to the transistor to control the channel resistance of the transistor, whereby the channel resistance of the transistor is calibrated for changes in the calibration parameter.

11. The amplifier of claim 10, wherein the calibration parameter is selected from the group consisting of an operating temperature of the transistor and a fabrication process of the transistor.

12. The amplifier of claim 10, wherein the circuit element is a digital resistor and the characteristic is resistance.

13. The amplifier of claim 10, wherein the amplifier is a switching power amplifier and the transistor includes a plurality of segment FET elements.

14. The amplifier of claim 10, wherein the transistor is a segmented transistor comprising a plurality of segment transistors having binary weighted channel widths.

15. The amplifier of claim 10, wherein the transistor is a segmented transistor comprising a plurality of segment transistors having binary weighted channel widths.

16. The amplifier of claim 10, wherein each of the segment transistors is controlled by a corresponding switch under the control of the calibration word.

17. The amplifier of claim 16, wherein each switch comprises a transistor.

18. The amplifier of claim 15, wherein less than all of the segment transistors are controlled by a corresponding switch under the control of the calibration word.

19. The amplifier of claim, 10 wherein the transistor is fabricated using a CMOS process.

20. The amplifier of claim 10, wherein the calibration circuit comprises:
   a comparator with a first input connected to the circuit element;
   a voltage source connected to a second input of the comparator; and
   an up/down counter having an up/down input connected to an output of the comparator and a multiple bit output connected to a control input of the circuit element, the multiple bit output of the counter corresponding to the calibration word.

\* \* \* \* \*